(12) United States Patent
Bet et al.

(10) Patent No.: US 7,691,731 B2
(45) Date of Patent: Apr. 6, 2010

(54) DEPOSITION OF CRYSTALLINE LAYERS ON POLYMER SUBSTRATES USING NANOPARTICLES AND LASER NANOFORMING

(75) Inventors: Sachin M. Bet, Orlando, FL (US); Aravinda Kar, Oviedo, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 143 days.

(21) Appl. No.: 11/686,572

(22) Filed: Mar. 15, 2007

(65) Prior Publication Data

US 2007/0218657 A1 Sep. 20, 2007

Related U.S. Application Data

(60) Provisional application No. 60/782,667, filed on Mar. 15, 2006.

(51) Int. Cl.
*H01L 21/20* (2006.01)
*H01L 21/36* (2006.01)

(52) U.S. Cl. ............ 438/479; 438/478; 257/E21.174

(58) Field of Classification Search ............ 438/479; 257/E21.174
See application file for complete search history.

(56) References Cited

U.S. PATENT DOCUMENTS

| | | | | |
|---|---|---|---|---|
| 2003/0117476 A1* | 6/2003 | Cross et al. | ............ | 347/107 |
| 2004/0169786 A1 | 9/2004 | Yamazaki et al. | | |
| 2004/0245648 A1* | 12/2004 | Nagasawa et al. | ............ | 257/772 |
| 2005/0064204 A1* | 3/2005 | Lalli et al. | ............ | 428/428 |
| 2005/0104125 A1* | 5/2005 | Sato et al. | ............ | 257/347 |
| 2006/0113894 A1* | 6/2006 | Fujii et al. | ............ | 313/499 |

OTHER PUBLICATIONS

Ichitsubo, T; Koujina, M; Kawashima, M.; Hirao, M. Fabrication of isolated FePd nanoparticles by sputtering and heat treatment May, 2003 Japan Society of Applied Physics vol. 42 pp. 2858-2859.*

(Continued)

*Primary Examiner*—Alexander G Ghyka
*Assistant Examiner*—Abdulfattah Mustapha
(74) *Attorney, Agent, or Firm*—Jetter & Associates, P.A.

(57) ABSTRACT

A method of forming crystalline semiconducting layers on low melting or low softening point substrates includes the steps of providing an aqueous solution medium including a plurality of semiconductor nanoparticles dispersed therein having a median size less than 10 nm, and applying the solution medium to at least one region of a substrate to be coated. The substrate has a melting or softening point of <200° C. The solution medium is evaporated and the at least one region is laser irradiated for fusing the nanoparticles followed by annealing to obtain a continuous film having a recrystallized microstructure. An article includes a polycrystalline semiconducting layer including a plurality of crystallites predominately in the size range of 2 to 50 μm, and a substrate having a melting or softening point of <200° C. supporting the semiconducting layer. An average grain size of the crystallites is less at an interface proximate to the semiconducting layer as compared to an average grain size further away from the interface.

9 Claims, 8 Drawing Sheets

OTHER PUBLICATIONS

Visit Vao-Soongnern, Guoqiang Xu, Wayne L. Mattice Structure formation in the crystallization and annealing of tetracontane nanoparticles Jul. 2004 Wiley-VCH Verlag vol. 13 pp. 539-549.*

Y. F. Guan, A. J. Pedraza, J. D. Fowlkes and D. A. Joy Nanostructure produced by ultraviolet laser irradiation of silicon. II. Nano Protrusions and nanoparticles Nov. 2004 American Vacuum Society B 22(6) pp. 2836-2843.*

McAlpine et al. "High-Performance Nanowire Electronics and Photonics and Nanoscale Patterning on Flexible Plastic Substrates", Proceedings of the IEEE, (2005), vol. 93, No. 7, pp. 1357-1363.

Caricato et al. "Matrix Assisted Pulsed Laser Evaporation for TiO2 Nanoparticle Thin Film Deposition", Digest Journal of Nanomaterials and Biostructures, (2006), vol. 1, No. 2, pp. 43-47.

* cited by examiner (a)

DEPOSITION OF CRYSTALLINE LAYERS ON POLYMER SUBSTRATES USING NANOPARTICLES AND LASER NANOFORMING

CROSS-REFERENCE TO RELATED APPLICATIONS

The present application incorporates by reference and claims priority to provisional application Ser. No. 60/782,667 entitled "DEPOSITION OF CRYSTALLINE LAYERS ON POLYMER SUBSTRATES USING NANOPARTICLES AND LASER NANOFORMING" filed on Mar. 15, 2006.

STATEMENT REGARDING FEDERALLY SPONSORED RESEARCH OR DEVELOPMENT

The United States Government has rights in this invention pursuant to DARPA-funded SBIR Phase I project Contract No. W31P4Q-04-C-R365.

FIELD OF THE INVENTION

The invention relates to articles having crystalline regions or crystalline films on low melting or softening point polymer substrates and laser-based methods of forming the same from nanoparticle comprising solutions.

BACKGROUND

Thin film microelectronic devices are increasingly becoming important especially in portable lightweight systems such as ultra lightweight cellular phones, high resolution displays, lightweight and flexible laptop and desktop monitors, thin wall-size television screens, and flexible radar systems. Recent advances in physical vapor deposition (PVD) chemical vapor deposition (CVD) techniques and the use of excimer laser annealing (ELA) and solid phase annealing (SPA) have reduced the processing temperatures considerably, thus promoting the use of inexpensive lightweight polymer substrates. However, existing silicon film preparation methods produce amorphous, or randomly aligned microcrystalline or polycrystalline Si films containing high densities of intrinsic microstructural defects which limit the utility of such films for high quality microelectronic applications.

Deposition of near-single crystal or single crystal Si films on polymer substrates is the first step toward achieving high quality flexible microelectronics. However, the non-crystalline nature of polymer makes it very difficult to employ a number of existing vapor-liquid and solid phase epitaxial growth processes because such processes rely on the crystalline character of the substrates. Secondly, the low melting or softening temperature of polymers makes it impractical to utilize the steady-state directional solidification processes, such as zone melting recrystallization of Si films on $SiO_2$ using a CW laser, a focused lamp, an electron beam or a graphite strip heater, previously developed for producing single crystal Si films. Usually the thin films formed on amorphous substrates are amorphous or are randomly polycrystalline in the sub-micrometer scale. Therefore, a low temperature process for forming highly crystalline or single crystal layers on temperature sensitive polymeric substrates is required.

SUMMARY

A method of forming crystalline semiconducting layers on low melting or low softening point substrates includes the steps of providing an aqueous solution medium including a plurality of semiconductor nanoparticles dispersed therein having a median size less than 10 nm, and applying the solution medium to at least one region of a substrate to be coated. The substrate has a melting or softening point of <200° C. The solution medium is evaporated and the region is laser irradiated for fusing the nanoparticles followed by annealing to obtain a continuous film having a recrystallized microstructure. The deposition of thin films using nanoparticles as a precursor is referred to herein as nanoforming in the present application.

In a preferred embodiment the fusing is performed at a first power for a first time, and the annealing is performed at a second power for a second time, wherein the second power is lower than the first power, and the second time is longer than the first time. The laser irradiating step can comprises continuous wave (CW) laser beam heating.

The aqueous solution can consist essentially of water and the nanoparticles. The evaporating step can comprises laser evaporating. The at least one region can be a single continuous film, or comprise a plurality of spaced apart regions. The nanoparticles can comprise silicon nanoparticles, and the method further comprise the step of in situ doping of the silicon nanoparticles, wherein dopants from the doping are activated during the laser irradiating step. In one embodiment, the method includes the step of placing a plurality of single crystal seeds on the substrate before the applying step.

An article comprises a polycrystalline semiconducting layer comprising a plurality of crystallites predominately in the size range of 2 to 50 μm, and a substrate having a melting or softening point of <200° C. supporting the semiconducting layer. An average grain size of the crystallites is less at an interface proximate to the substrate as compared to an average grain size in the semiconducting layer remote from the interface. The semiconducting layer can comprises silicon or germanium. In one embodiment, the article further comprises a silicon dioxide layer disposed between the semiconducting layer and the substrate, wherein the semiconducting layer comprises a plurality of spaced apart regions. The spaced apart regions can be polycrystalline or single crystal. The substrate can comprise a polymer.

BRIEF DESCRIPTION OF FIGURES

There is shown in the drawings embodiments which are presently preferred, it being understood, however, that the invention can be embodied in other forms without departing from the spirit or essential attributes thereof.

FIG. 8(*a*) is a plot of Raman peak position observed with increasing incident laser power in CW mode for laser nanoformed thin films on polymer substrates. The standard used is a single crystal silicon sample.

FIG. 8(*b*) is a plot of Raman peak position observed with increasing annealing time for laser nanoformed thin films on polymer substrates at 1 W in CW mode on rigid polymer substrate.

DESCRIPTION OF THE PREFERRED EMBODIMENTS

A method of forming crystalline semiconducting layers on low melting or low softening point substrates includes the steps of providing an aqueous solution medium including a plurality of semiconductor nanoparticles dispersed therein having a median size less than 10 nm, and applying the solution medium to at least one region of a substrate to be coated. Although not preferred, other solution mediums can be used which have boiling points and surface tension which approximate that of water. The substrate has a melting or softening point of <200° C. The solution medium is evaporated and the at least one region is laser irradiated for fusing the nanoparticles followed by annealing to obtain a continuous film having a recrystallized microstructure. Damage to the polymer or other low temperature substrate can be prevented, or reduced to undetectable levels, by carefully selecting the process parameter such as the laser power and the irradiation time during laser film formation as well as during laser annealing.

In a preferred embodiment, fusing is performed at a first power for a first time, and annealing is performed at a second power for a second time, wherein the second power is lower than the first power, and the second time is longer than the first time. The invention is enabled by the unexpected finding that isolated nanoparticles (e.g. <10 nm) melt and can recrystallize at a temperature significantly below the bulk melting temperature of the bulk material, such as nearly 300° C. lower in the case of silicon. As described below, using a particular set of experimental conditions, polycrystalline silicon films containing silicon crystallites of about 10-12 µm size have been produced on low melting point polymer substrates by using the present method, without measurably degrading the polymer substrate.

The substrate generally has a melting or softening point of <200° C., such as certain polymer substrates. However, the substrate can include higher temperature materials, including glass, semiconductor substrates including semiconducting wafers, as well as ceramics and metal substrates.

The solution is evaporated, followed by a fusing step where the particles are fused together using a laser beam to obtain a polycrystalline continuous film in the region(s). The surface tension of the solution medium helps keep the nanoparticles in contact to form continuous film.

As noted above, isolated nanoparticles (e.g. silicon nanoparticles <10 nm, or so) melt and recrystallize at a temperature significantly below the bulk melting temperature of the bulk material. The nanoparticles can be sintered to form a thin film by controlling the heat input to the precursor. Similar to the reduced melting temperature of nanoparticles, unexpectedly it has been found that the sintering temperature of nanoparticles is provided at a temperature significantly less as compared to the sintering of larger particles. However, the presence of a thin oxide layer on the surface of these nanoparticles can affect the sintering and recrystallization processes. Accordingly, in a preferred embodiment nanoforming is performed in a non-oxidizing ambient.

Figure 1:
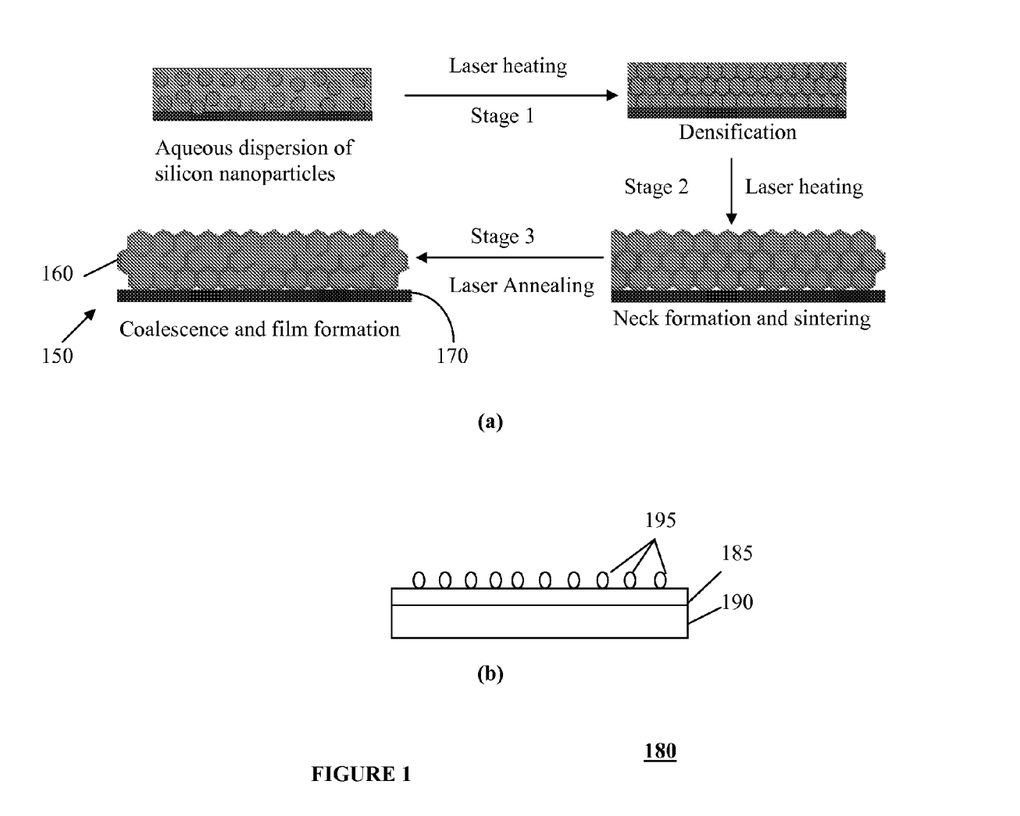
FIG. 1(a) shows steps in a likely mechanism of film formation during laser nanoforming of thin film polycrystalline silicon from an aqueous nanoparticle comprising dispersion, including a cross sectional schematic of an exemplary article according to the invention formed after coalescence and film formation.
FIG. 1(b) shows a cross sectional view of an article 180 comprising a dielectric layer 185 disposed between a semiconducting layer which comprises a plurality of spaced apart crystalline (single crystal or polycrystalline) regions 195 and the substrate 190.

The mechanism believed to be responsible for film formation is shown in FIG. 1(*a*). A droplet of nanoparticles in dispersant is first placed on polymer or other low temperature substrate and in stage 1 indicated as being a "laser heating" step is irradiated with a laser beam. The incident energy initially heats the particles as well as the dispersion medium. When the temperature reaches the vaporization temperature of the liquid dispersant (e.g. water), the liquid begins to evaporate and the surface tension of the remaining dispersant causes the nanoparticles to move around leading to agglomeration and densification of the nanoparticles. This process continues the entire dispersant is evaporated and a thin spread of dense agglomeration of the nanoparticles is formed as shown in FIG. 1(*a*) as a "densification" step. Continued heating initiates the sintering causing interfacial fusion of the nanoparticles and neck formation among multiple particles which is shown as stage 2 in FIG. 1(*a*). Further heating in stage 3 identified as "laser annealing" leads to the neck growth followed by coalescence of smaller particles to form an article 150 having a continuous coalesced film 160 disposed on a substrate 170. The degree of coalescence has been found to depend on the laser heating time. The surface area of the nanoparticles decreases continuously during sintering which can be attributed to the anticipated reduced sintering temperature.

The article 150 can comprises a polycrystalline semiconducting layer comprising a plurality of crystallites predominately in the size range of 2 to 50 µm, and a substrate having a melting or softening point of <200° C. supporting the semiconducting layer. A characteristic of films/layers formed using the present invention is that the average grain size of the crystallites is less at an interface proximate to the substrate as compared to an average grain size in the semiconducting layer remote from the interface.

In an alternate embodiment shown in FIG. 1(*b*), the article 180 comprises a dielectric layer 185 (e.g. a silicon dioxide layer) disposed between the semiconducting layer which comprises a plurality of spaced apart crystalline (singal crystal or polycrystalline) regions 195 and the substrate 190. This basic structure can be used to form a variety of devices, including quantum-dot based devices.

The nanoparticles are generally semiconducting nanoparticles, such as Si, Ge, SiC, GaN, GaAs or InP. However, the nanoparticles may also be metallic or dielectric particles.

Figure 2:
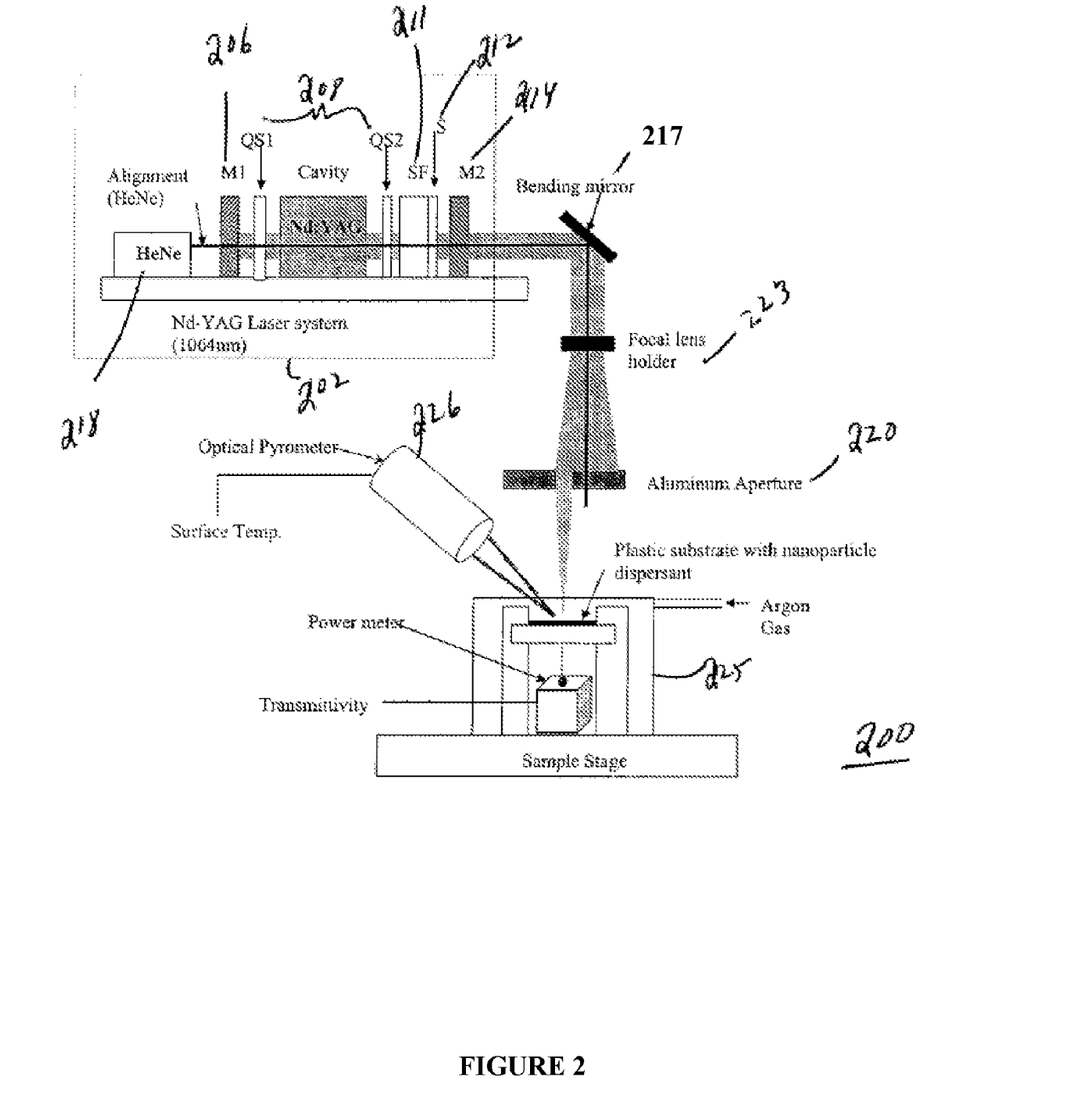
FIG. 2 is a schematic of an exemplary deposition system for depositing thin films using nanoparticles and laser nanoforming according to the invention.

FIG. 2 shows the schematic of an exemplary nanoforming system 200 according to the invention used for most experiments performed which are described below in the Examples section. System 200 includes a Q-switched Nd-YAG laser system 202, a bending mirror 217, focal lens holder 223, and aluminum aperture 220 in the beam path and a vacuum chamber 225 (pump not shown) for placing the substrate with nanoparticle dispersant therein. A vacuum is not required, however, it is advantageous for avoiding film contamination or oxidation of nanoparticles. Alternatively, for avoiding contamination or oxidation an inert gas (argon) atmosphere can be used. Laser system 202 includes first mirror (M1) 206, Q-switch 208 comprising QS1 and QS2 with a Nd:YAG laser cavity therebetween for provided laser pulses, followed by a filter 211 which includes a shutter 212, followed by second mirror (M2) 214. A HeNe laser 218 is shown for alignment purposes. Optical pyrometer 226 is provided for monitoring the temperature on the substrate surface during processing which can be fed back to laser system 202 (not shown) to control the temperate during the process. The argon gas flow shown in FIG. 2 is used to limit oxidation in the case of oxidizable nanoparticles such as Si.

The aperture 220 preferably includes multiple apertures which can be used to utilize energy from a high energy beam in order to deposit thin films on isolated spots at a number of predetermined locations in a single exposure to the laser beam. On the other hand a high energy beam can be spread (e.g. using advanced optics, homogenizers) over a large area to supply thermal energy to the sample at low intensity in order to deposit uniform thin films over a large area.

Although not required to practice the present application, Applicants not seeking to being bound thereto, provide a mechanism believed to explain the unexpected result provide by the present invention. The invention is believed to benefit from an unexpected thermodynamic phenomena. Specifically, a particle size in the lower nanoscale range, such as <10 nm can lower the effective melting temperature to be significantly less than the melting temperature of the corresponding bulk material. The use of nanoparticles <10 nm according to the present invention, therefore, provides a method of depositing crystalline thin films on polymer or other substrates that have low damage threshold temperatures.

The present application is described relative to the deposition a single silicon thin film on a low softening point polymer substrates using aqueous dispersion of silicon nanoparticles and a laser nanoforming process. The softening point of the polymer substrate is generally less than 300° C., preferably less than 200° C., such as Fire Retardant glass fiber epoxy laminate (FR4) or polycarbonate (PC). FR4 is a composite of a resin epoxy reinforced with a woven fiberglass mat and is commonly used for making a printed circuit board (PCB). It is a material from the class of epoxy resin bonded glass fabric (ERBGF).

The softening point is roughly around 135° C. for FR4 and 160° C. for PC. Although described relative to an aqueous dispersion and silicon nanoparticles, other dispersions and other nanoparticle compositions may be used with the invention. Although described relative to nanoforming a single layer on a polymer substrate, the process can be repeated to form a plurality of nanoformed layers. Moreover, conventional photolithography and low temperate depositions (e.g. LPCVD) can be used in conjunction with the invention to build complex structures, such as integrated circuits.

As noted above, rather than forming a single contiguous large area sheet, one or more isolated contiguous film spots can also be fabricated in a variety of desired shapes on the temperature sensitive substrate. In one embodiment, spots can be fabricated one at a time by scanning the laser beam to irradiate spaced apart regions (such as using a Q-switched laser system 200 as shown in FIG. 2) without the aid of any masking technique or using a suitable laser aperture array for forming multiple spots. Alternatively, small quantities of solution can be dispensed at a plurality of spaced apart regions.

The crystallites comprising the film can be a preferentially aligned film using single crystal seeds placed at predetermined locations on the substrate, or using known directional heating techniques. Epitaxial growth can proceed from the seeds. A crystalline seed layer placed in predetermined locations allows epitaxial film growth using the above described technique. Lateral epitaxial growth technique can also be employed by moving the substrate relate to the laser source.

Adding advanced optics to the deposition system allows thin film deposition on large as well as extremely small areas. A computer-controlled nanoparticle dispenser and substrate motion system can further improve the film thickness uniformities and compositional homogeneities. Contamination-free films with controlled doping can be obtained by using a high purity doping system. For example, laser aided doping of Si can utilize nitrogen or phosphorous (n-type dopants) or boron (p-type dopant). For example, nitrogen doping can be carried out using a gaseous source. In this embodiment film formation and recrystallization can be carried out in a nitrogen gas atmosphere at approximately 30 psi of pressure. Boron doping can be carried out using a boron powder sample added to the dispersion or using a gaseous source of boron.

As noted above, articles according to the invention can comprise a dielectric layer (e.g. a silicon dioxide layer) disposed between said semiconducting layer which comprises a plurality of spaced apart regions polycrystalline regions and the substrate, which can be used to form a variety of devices, including quantum-dot based devices. Quantum dot devices are based on quantum confinement phenomenon can occur when electron movement is constrained in one or more directions. In a three dimensional restriction, called a quantum cage, an electron becomes agitated when the size of the cage shrinks.

This condition effectively relaxes the momentum conservation requirement governing the transfer of electron from valence band to conduction band and vice-versa in indirect bandgap semiconductors. Since the momentum conservation requirement is relaxed, the electron-photon energy transfer becomes efficient and this boosts the rate of light emission by the semiconductor.

Using the present invention, quantum cages can be formed by creating tiny (e.g. 2-10 nm corresponding to 10 to 50 atoms in diameter) regions of single crystal or polycrystalline semiconductor material (e.g. silicon) on a substrate having a dielectric surface, such as a silicon dioxide surface. In a preferred embodiment, a Gaussian laser beam is used, which is small enough to generally provide the desire size. The beam can be scanned, if desired. Solar cells, LEDs, fluorescence spectroscopy, quantum computation and other semiconductor quantum dot device structures are practical devices which one can make using this embodiment of the present invention.

Laser nanoforming according to the invention provides significant advantages over conventional film forming methods, including, but not limited to:

(i) localized heating of the nanoparticles without appreciably heating the surrounding substrate,
(ii) the amount of precursor material required for thin film deposition is significantly reduced,
(iii) no need to preheat the substrate,
(iv) little or no damage to the underlying substrates due to low heat input,
(v) thin films can be deposited with lower defect density. Low defect density for electrically conductive materials results in higher electrical conductivity provided by enhanced carrier mobility, and
(vi) the laser can transmit through the polymer substrate without being substantially absorbed by the polymer or other substrate. Accordingly, the laser beam can be passed through the polymer (or other substrate) to heat the silicon at the Si-polymer interface in order to preferentially anneal and recrystallize the interfacial Si atoms.

The invention is expected to yield commercially viable device grade thin films. Accordingly, the invention is expected to benefit a variety of applications. Exemplary applications include cell phones, thin film microelectronic devices, and thin films on thermally sensitive substrates. In the case of the quantum cage embodiment, solar cells, LEDs, fluorescence spectroscopy, quantum computation and other semiconductor quantum dot device structures can be made.

EXAMPLES

It should be understood that the Examples described below are provided for illustrative purposes only and do not in any way define the scope of the invention.

An aqueous dispersion of 5 nm Si particles (20 gm/200 ml conc., 1.5 nm one standard deviation), was placed on a polymer (FR4 or PC) substrate and irradiated using system 200 shown in FIG. 2 using CW radiation from the Nd:YAG laser having a wavelength 1.06 µm. Through an overall thermal energy balance, it was found that very low laser power in the range of 2-9 W was sufficient to deposit Si thin films of thickness 1-3 µm and area 3 mm×3 mm. The size of each polymer substrate was approximately 10 mm×10 mm. Since a Gaussian laser beam (single mode) has much higher irradiance at its center than at its edge, direct irradiation with such a beam causes non-uniform heating of the precursor. This can affect the quality of the thin film formed. However, a multimode beam or a homogenous beam using beam homogenizers and different apertures may also be used. In contrast to a single mode beam which is has a Gaussian shaped cross sectional beam intensity, for lasers with a high order multimode structure, the cross sectional intensity of the beam can be almost rectangular, which renders the heating across the laser beam substantially more uniform.

The thin aluminum aperture plate 220 having a square hole of 1 mm side was inserted between the laser beam and the sample during the laser nanoforming process to obtain approximately 2-9 W of power from the edge of a high power Gaussian laser beam. This energy was then utilized for treating the samples along with the dispersant described above. The aperture 220 utilized demonstrates that a plate containing multiple apertures can be used to utilize energy from a high energy beam in order to deposit thin films on isolated spots at a number of predetermined locations in a single exposure to the laser beam. Alternatively, a high energy beam can be spread (e.g. using advanced optics, homogenizers) over a large area to supply thermal energy to the sample at low intensity in order to deposit uniform thin films over a large area.

The films were deposited using two different techniques. The first technique was a Dry Film Forming (DFF) method. In this approach the aqueous medium was dried in air and argon to obtain a network of silicon particles which were then fused and recrystallized with the laser beam. The second technique was a Wet Film Forming (WFF) method. In this approach the aqueous medium was evaporated and the silicon particles were fused with a laser beam simultaneously to obtain a continuous film, and then the films were annealed by laser heating to obtain recrystallized microstructures. Experiments were carried out in air as well as in argon ambients.

The WFF was found to generally be a better technique for obtaining continuous film of crystalline silicon and was therefore utilized for carrying out most experiments. The purpose of two laser heating steps in the WFF approach is to first fuse the Si nanoparticles together at slightly higher power without causing any measurable thermal damage to the polymer (or other low temperature) substrate and then anneal it at lower power for longer duration of time to allow sufficient time to significantly increase the crystallinity of the film. In the case of silicon nanoforming, increase crystallinity is reflected in the median grain size obtained being at least several microns as described below.

Materials Characterization

Films formed using the invention were characterized by using optical microscopy, Scanning Electron Microscopy (SEM), Energy dispersive spectroscopy (EDS), X-ray photoelectron spectroscopy (XPS) and Raman spectroscopy. A Nikon Optiphot 100 optical microscope was used to examine the continuity of the film surface and to evaluate if any detectable damage occurred to the underlying polymer substrate. JEOL SEM 6400F was used for SEM and EDS characterization of the films. The samples were coated with a thin layer of platinum to prevent electrical charging during interaction with the electron beam of the SEM. Scanning Electron Microscopy (SEM) was carried for microstructural features an Energy Dispersive Spectroscopic analysis (EDS) was carried out for composition and impurities. XPS unit of Physical Electronics PHI 5400 was used to perform XPS for quantitative analysis to ascertain the type of impurities and to amass bond information of the recrystallized film. Raman spectroscopy was carried out using a Reinshaw RM1000B Micro-Raman Spectrometer with a CCD (Charge-coupled devices) detector and Argon 524 nm excitation unit. The purpose of the Raman spectroscopy performed was to determine the Raman shift towards crystallinity with increasing laser incident power and laser annealing time.

Results and Discussion

Thin Si films were deposited on both flexible (polycarbonate (PC)) and rigid (FR4) polymer substrates using aqueous dispersant containing Si nanoparticles of diameters 5 nm approximately. A continuous film of Si was first formed on the substrate with CW Nd:YAG laser irradiation in the power rang of 5-9 W, irradiation time 30-60 s and laser spot size 3 mm. The film was subsequently irradiated with a beam of lower power (0.5-2 W), longer irradiation time (10-180 s) and laser spot size of 3 mm. The temperature of the laser-irradiated spot was measured during laser irradiation while the film was being formed by using optical pyrometer 226 shown in FIG. 2.

Figure 3:
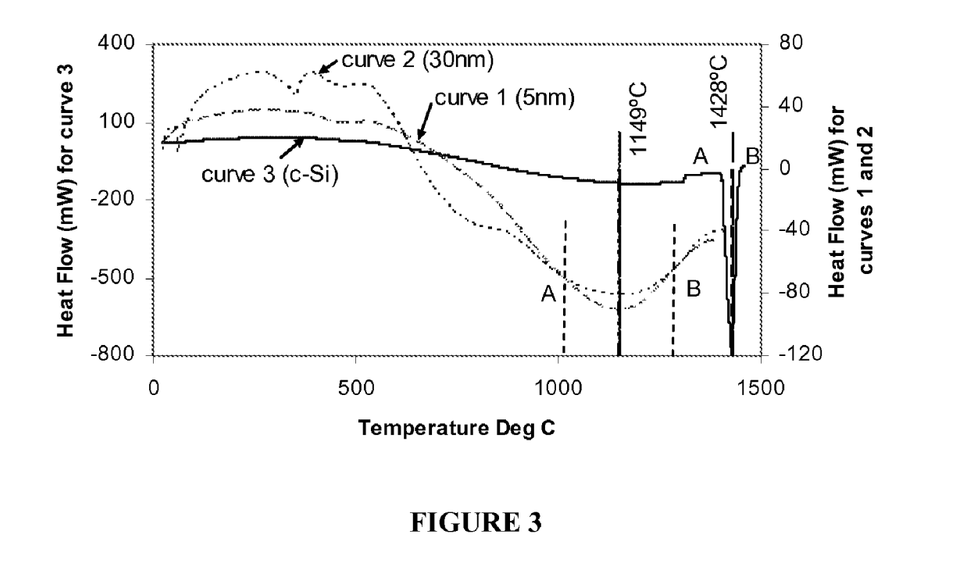
FIG. 3 provides DSC data for single crystal silicon, 5 nm and 30 nm silicon particles showing bulk melting point of nanoparticles ~1149° C. approximately 279° C. lower than the bulk melting temperature of silicon ~1428° C. Point A corresponds to 90% of $T_{mn}$=1149° C. and point B corresponds to 110% of $T_{mn}$ for curves 1 and 2.

Differential Scanning Calorimetry (DSC) for Estimating the Reduction of Melting Temperature of Silicon Nanoparticles The melting temperature of silicon was found to begin to decrease very significantly for particles sizes smaller than 5 nm. Differential Scanning Calorimetry (DSC) was carried out on a TA Instrument SDT 2960 simultaneous DSC/TGA. FIG. 3 shows DSC data for 5 and 30 nm particles (5 gm/100 ml conc., 4.5 nm one standard deviation) and for a single crystal silicon wafer, indicating that the silicon nanoparticles were found to melt at approximately 1149° C. which is 279° C. lower than the bulk melting temperature of single crystal silicon 1428° C. Thus, the melting temperature of the nanoparticles was found to be reduced by ~20% as compared to the bulk Si melting temperature. However, the melting temperature of both as received nanoparticles (5 nm and 30 nm) samples indicated the same melting temperature, $T_{mn}$=1149° C. This anomaly may be due to the formation of native oxide. Since 5 nm particles are likely more reactive than 30 nm particles, the 5 nm particles would be expected to form a native oxide more readily than 30 nm particles. Thus, the melting temperature of the nanoparticles in dispersion is expected to be higher than that of pure nanoparticles. Measurement of the temperature by using optical pyrometer 226 during laser nanoforming of silicon film showed a melting temperature of 1188° C. for both samples.

Figure 4:
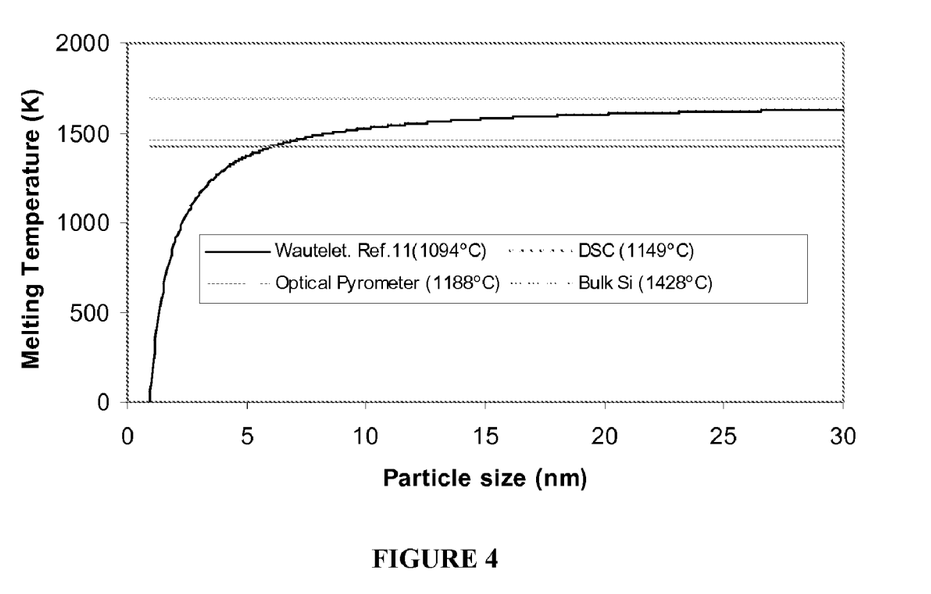
FIG. 4 shows a comparison of melting temperatures obtained by various techniques. The theoretical calculated values for the melting temperature is $T_{mn}$=1094° C., using DSC is $T_{mn}$=1149° C., using optical pyrometer is $T_{mn}$=1188° C. and for bulk silicon is $T_{mb}$=1428° C.

The melting temperature of Si nanoparticles was also calculated using the following expression:

$$T_{mn} = T_{mb}(1 - \beta/2r) \tag{1}$$

which is based on a surface phonon instability model. Here $T_{mn}$ is the melting temperature of nanoparticles, $T_{mb}$ is the melting temperature of bulk silicon, r is the radius of the nanoparticle and $\beta$ is a constant that depends on the interatomic forces and distances. The values of $\beta$ 1.88 (nm) and $T_{mb}$ (1410° C.) for silicon are known. The radius of nanoparticle r is taken as 5 nm. The calculated value of melting temperature is 1094° C. which is somewhat lower than the measured temperature (1149° C.) due to DSC measurement and 1188° C. due to IR pyrometer measurement) as shown in FIG. 4. This discrepancy may be due to non-uniform particle size distribution in sample as evident from the DSC data.

FIG. 3 shows that the DSC curve is flat initially in the case of crystalline silicon, while the curve rises upward indicating an exothermic process for the nanoparticle sample. This is likely because the nanoparticles are mostly amorphous and therefore they are in a higher energy state. Upon heating this energy is released showing broad exothermic curve. Continued heating resulted in a deep and sharp endothermic peak near the melting point in the case of crystalline silicon, whereas a broad shallow endothermic curve is observed in the case of the nanoparticle sample. This broad shape of the curve for silicon nanoparticles indicates that the aqueous dispersant contained nanoparticles of varying sizes up to 30 nm, and that most of the particles are close to the characteristic size (~5 nm) at which the changes in properties (e.g., melting point, above gap luminescence, electrical properties, optical properties and magnetic properties) are significant. Generally, the DSC curve shows a steep depression around the melting temperature for pure crystalline samples (e.g. curve 3) and the latent heat of melting determined by measuring the area of the entire depressed region. However, the DSC curves of the nanoparticle samples (curves 1 and 2) show a broad depression around the melting temperature. This broadening of the DSC curve is due to the non-uniform size distribution of the nanoparticles in the samples. Therefore, a small region around $T_{mn}=1149°$ C. corresponding to $T_{mn}\pm10\%$ of $T_{mn}$ (points B and A respectively in FIG. 3) considered to determine the latent heat of the melting of nanoparticles of a specific size (e.g. 5 nm and 30 nm).

Based on the area of the depression, the calculated latent heats of melting are 177.2 J/g, 853.4 J/g and 1711 J/g for 5 nm, 30 nm Si nanoparticles and single crystal bulk silicon respectively. These data indicate that the heat input required for melting nanoparticle is about 10-50% of that required for melting single crystal bulk silicon. The reduction in the amount of heat required to melt the nanoparticles allows carrying out laser nanoforming with less heat input to the substrate and consequently, the risk of thermal damage to the substrate is reduced considerably. These advantages of reduced heat input and reduction in melting temperature are utilized in laser nanoforming of crystalline silicon film on flexible substrates.

Optical Microscopy for Film Physical Characteristics and Substrate Damage

Optical microscopy was performed to examine the continuity of the film surface and to evaluate possible damage to the underlying polymer substrates. There was localize melting and fusion of particles resulting in a fairly smooth texture in isolated spots on the film obtained by the DFF method. Such films were produced to a greater extent when the particles were treated in air than in argon ambient. However, in both cases the films were discontinuous. The WFF method yielded continuous films in both the argon and air ambients. The density of the film was greater when the WFF process was carried out in air than in argon. This is believed to be because a large amount of heat is evolved due to exothermic reaction between the nanoparticles and oxygen during the laser treatment in air. As a result, thermal waves are induced in the droplet causing the clusters to break into fine particles which pack themselves well filling numerous voids.

The resulting film was found to be non-homogeneous with silicon crystallites dispersed in various regions of the film. This effect was observed to greater a extent for the films produced higher powers (7-9 W). The thickness of the film varied depending on the surface tension of the dispersant droplet on the polymer surface and the volume of the dispersant. Films up to 2.5 μm were formed in certain cases.

Surface micrographs were taken of the as-received rigid polymer substrate. The substrate surface was found to be rough containing 5 μm deep cup structures. Flowing nanoforming according to the invention, optical micrographs evidenced a fused crystalline silicon film on an undamaged rigid polymer substrate. Similar results were observed on flexible polymeric substrates. No damage to the underlying polymer substrate was observed for optimized laser processing parameters. Higher magnification SEM micrographs at 30000 X and 200 X further evidenced the absence of any detectable thermal damage on the polymer substrates.

Transmissivity measurements were carried out to examine the transmission of laser energy through the polymer substrates at the laser wavelength of 1.06 μm. The transmissivity was approximately 50% for both the rigid and flexible polymeric substrates. However, the transmissivity was 20-25% of the incident power during the laser treatment of silicon nanoparticle dispersion. Transmissivity is another factor contributing to little or no thermal damage of the substrate.

Scanning Electron Microscopy (SEM) Structural for Microstructural Features

Figure 5:
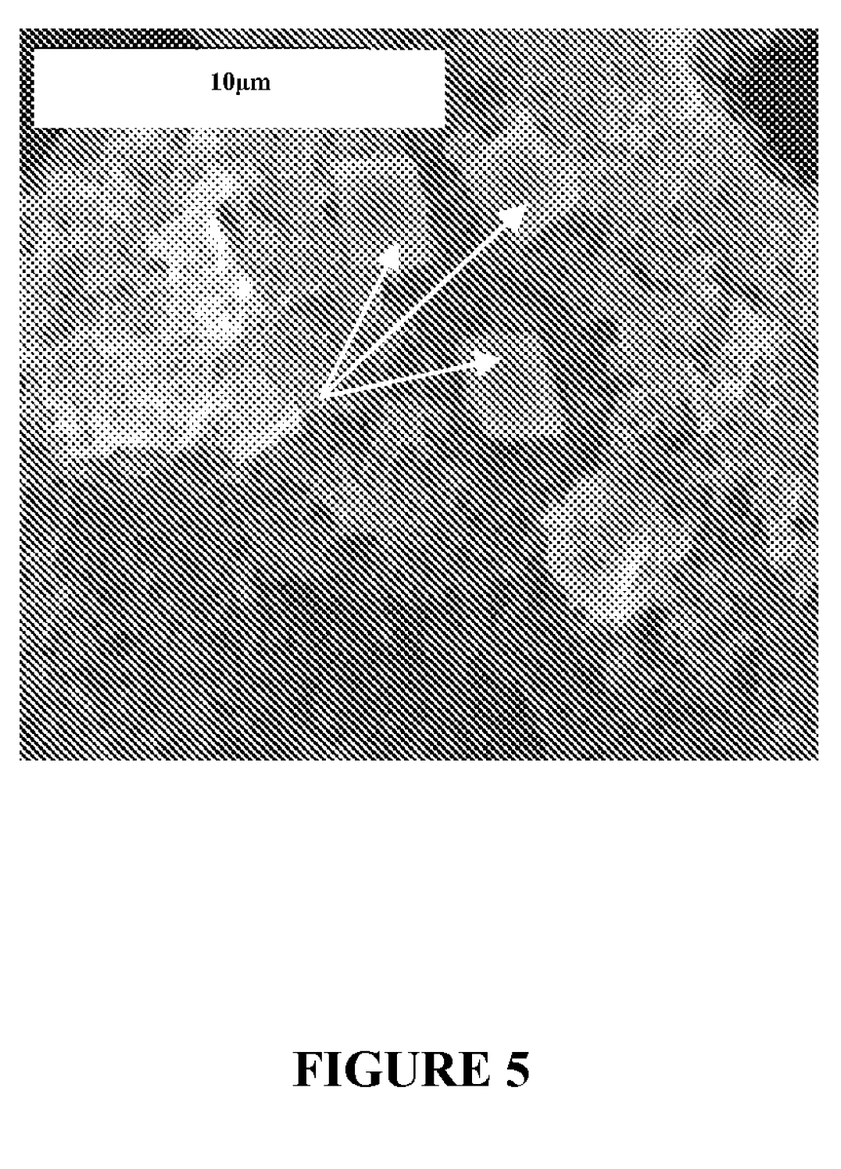
FIG. 5 is a scanned SEM image of a laser nanoformed film at 9 W in CW mode on flexible polymer substrate.

A JEOL SEM 6400F was used for SEM and EDS characterization of the films. The samples were coated with a thin layer of platinum to prevent electrical charging during interaction with the electron beam of SEM. A SEM image indicated silicon crystallites of 3-5 μm for the films formed at higher powers (5-9 W) without annealing. There was a very narrow irradiation time window for film formation at such high powers. The substrate was found to be damaged if the laser processing time exceeds this narrow window. After the film formation, the size of the crystallites increased with increase in the annealing time. A SEM image of a film crystallized at 9 W without annealing on a flexible polymer substrate was taken. A large number of crystallites of silicon was observed over the entire surface. FIG. 5 is a scanned SEM image showing 3-5 μm size crystallites of single crystal silicon. The density of such crystallites was low in the films that were formed at lower laser powers. However, annealing these films for longer time resulted in crystallites of greater size 10-12 μm.

The crystallites in FIG. 5 appear to lie above the coalesced silicon nanoparticle film, indicating that they are not generated from the film by the process of melting, recrystallization and growth but they are produce due the presence of small crystallite seeds in the silicon nanoparticles which undergo growth during laser nanoforming. Film formation at higher powers resulted in more dense and continuous films; however, the film texture did not appear as smooth as is usually obtained for melted and recrystallized films. The nanoparticles undergo sintering at high incident powers giving a rough continuous film. The rough (cup-like) structure of the substrate may also contribute for the observed texture of the film.

Energy Dispersive Spectroscopy (EDS) for Elemental Composition and Impurities

Figure 6:
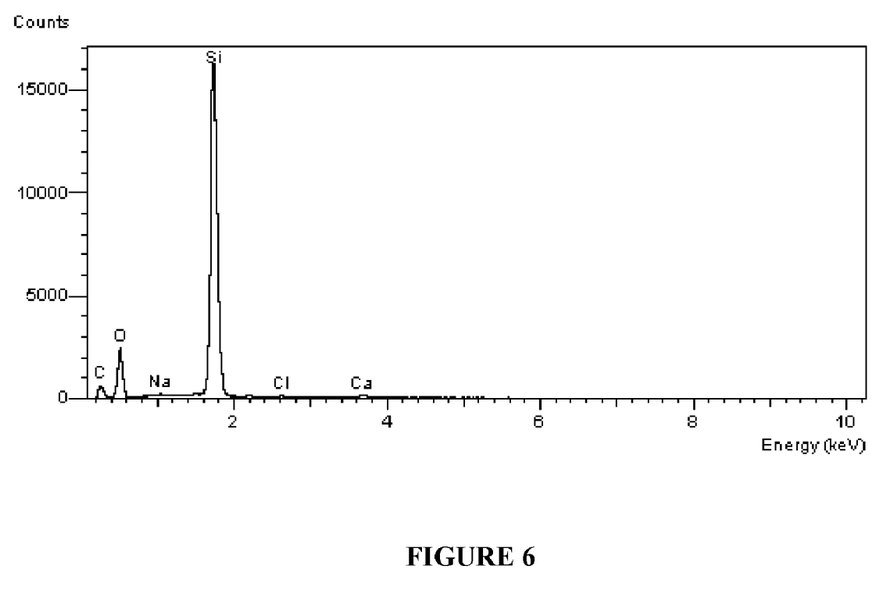
FIG. 6 is an EDS analysis on silicon nanoparticles laser treated on flexible polymer substrate showing Si, C and O along with Na, Cl and Ca.

EDS analysis was performed for as-dried silicon nanoparticle dispersion, laser nanoformed silicon film as well as the untreated region of polymer substrate. The as-dried silicon nanoparticle dispersion contains carbon (C), Oxygen (O) and Silicon (Si) as shown in FIG. 6. EDS analysis on untreated flexible polymer substrate shows only C an O typical of a polymeric sample as the detection of hydrogen is beyond the scope of the equipment. The EDS analysis of the nanoformed silicon films in air on flexible polymer substrates shows the presence of Si with increased amounts of O and C. The EDS analysis of as-received rigid polymer substrate shows the presence of C, O, and Bromine (Br). However, the films deposited on the rigid substrates shows the presence of Si, C, O and Br along with other elements such as Calcium (Ca), Sodium (Na), and Chlorine (Cl), indicating that the source of the other elements (Ca, Na, Cl) is mainly due to the surrounding atmosphere during laser nanoforming and not the substrate. The film deposited in the argon ambient shows the reduced amount of oxygen, carbon and silicon. Further studies through XPS analysis confirmed that the impurities Na and Cl are not present in the film although a small amount of Ca was detected.

Higher amounts of oxygen was observed in the films deposited in air than in argon ambient. Atmospheric oxygen reacts with silicon during laser treatment in air. Diffusion of oxygen through the dispersant and rapid heating and cooling inherent in laser processing leads to the trapping of oxygen within the film. Therefore an increased amount of oxygen is observed in laser-nanoformed films prior to annealing. This trapped oxygen is released during annealing, resulting in decreased oxygen content in the film with increased densification.

XPS Analysis for Composition and Bond Information

Figure 7:
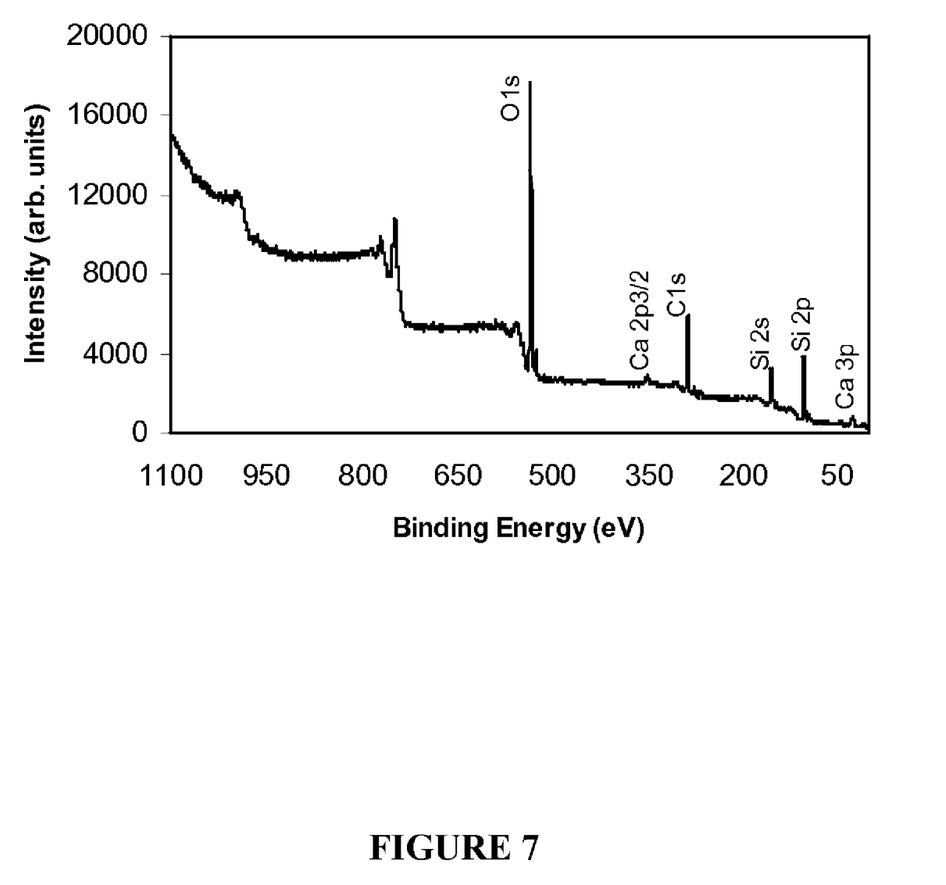
FIG. 7 is an XPS analysis of laser nanoformed silicon film on rigid polymer substrates showing 17% Si, 0.5% N, 0.7% Ca, 41.0% O and 40.6% C.

XPS analysis was carried out on Physical Electronics PHI 5400 ESCA/XPS unit for quantitative analysis to ascertain the type impurities of observed in the above mentioned EDS studies. Laser-nanoformed silicon films on rigid polymer substrate showed 17% Si, 0.5% N, 0.7% Ca, 41.0% O and 40.6% C as shown in FIG. 7. Oxygen O 1s SiOx/Si peak was observed at 532.5 eV indicating that the oxygen is primarily due to oxidation of silicon nanoparticles. Silicon Si SiO2 2p primary peak was observed at 103 eV and Si 2s $SiO_2$ secondary peak was observed at 154.6 eV, again indicating the formation of silicon dioxide upon exposure to atmosphere. Carbon showed the primary peak C1s corresponding to elemental carbon at 284.5 eV indicating its incorporation from the atmosphere, while Calcium showed the primary peak at 347.5 eV corresponding to Ca2p3/2 CaO/Ca0. 166 Ni0.833 and secondary peak Ca3p C a peak at 25.6 eV indicating the presence of Ca either in the form of oxide or its elemental form. These results have been obtained by comparing with standards. Higher amounts of oxygen and carbon were probably due to the samples being exposed to atmosphere for long duration of time prior to XPS. Therefore a thin surface layer of the sample was sputtered and further analyzed. The sputtered sample showed 23.5% Si, 0.7% Ca, 44.8% O and 30.8% C. There was an increase in the amount of silicon and oxygen and a reduction in the amount of carbon. Nitrogen was not detected after sputtering, indicating that it was mainly due to the atmosphere. There was no change in the amount of calcium, indicating that the presence of Ca may be due to the contamination of the instrument o some contamination from the atmosphere because neither the as-received nanoparticle nor the substrates were found to contain calcium.

Raman Spectroscopy for Estimating Higher the Shift to Higher Crystallinity

Figure 8A:
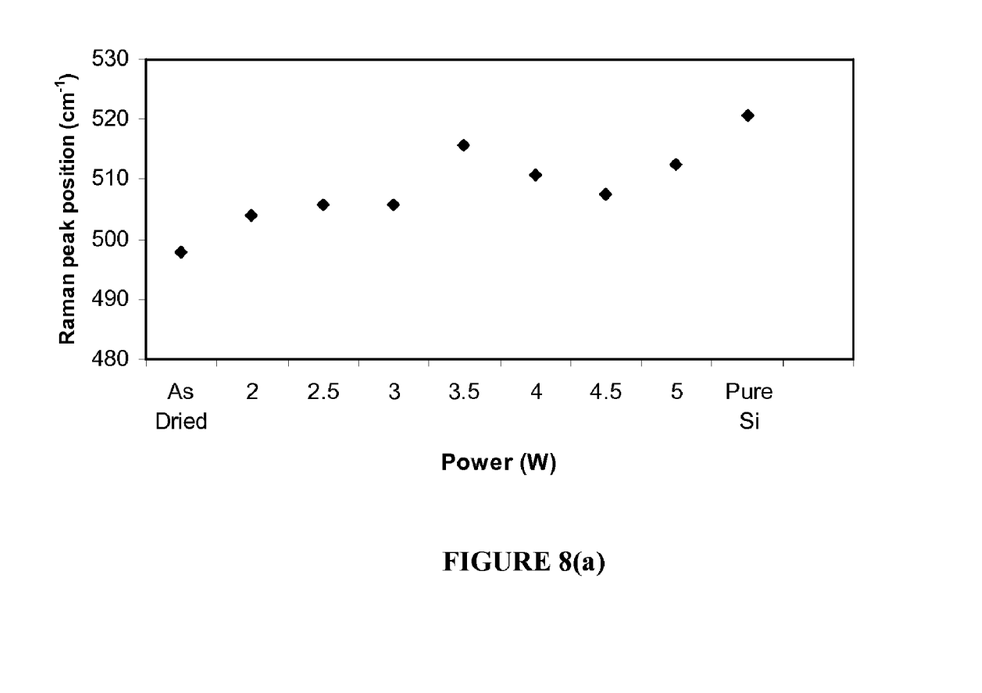
Figure 8B:
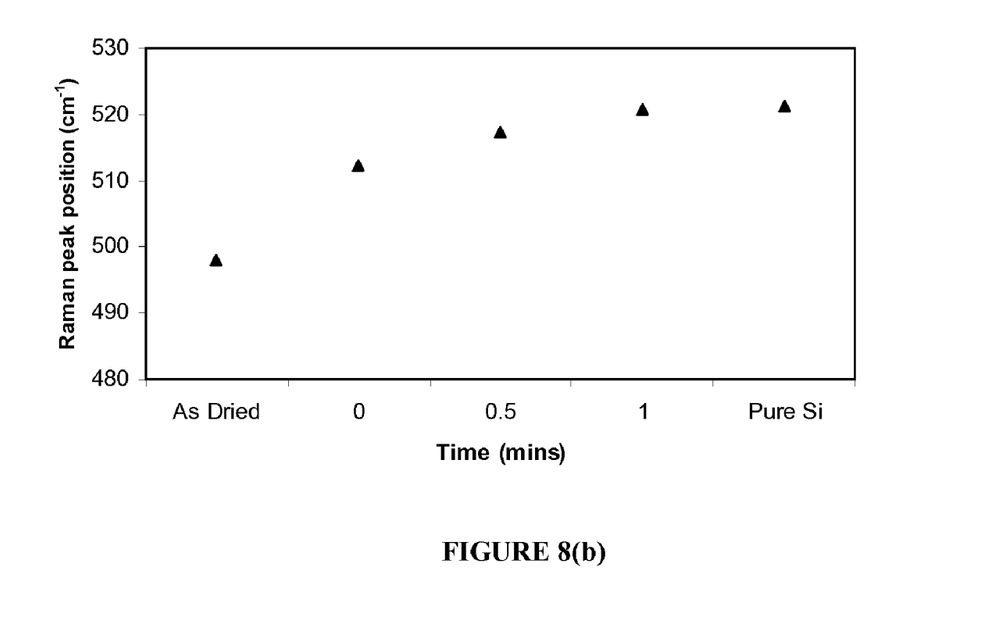

Raman spectroscopy was performed using a Reinshaw RM1000B Micro-Raman Spectrometer with a CCD detector and Ar-524 nm excitation unit. The purpose of Raman spectroscopy was to determine the Raman shift towards crystallinity with increasing laser incident power and laser annealing time. Silicon films deposited on rigid polymer substrates were used for this analysis. The Raman spectra for typical amorphous silicon are usually a very broad transmission optic (TO) peak at 480 cm-1 and a broad transmission acoustic (TA) peak at 150 cm-1 and it is a TO peak at 521.25 cm-1 (measured standard) for single crystal silicon. It is found that there is a shift from amorphous to more crystalline phases with increasing the laser power during film formation and irradiation time during laser annealing as shown in FIGS. 8(a) and (b).

The peaks of the as-received sample revealed a TO peak corresponding to crystalline silicon 497.86 $cm^{-1}$. This shows that the aqueous dispersion contain crystalline nanoparticles instead of amorphous Si. The crystalline nanoparticles likely act as seeds for the observed Si crystallites as evident in the SEM micrographs of the thin films on polymer substrates (see FIG. 5). FIG. 8(a) shows the shift in the Raman peak positions with Increasing incident laser power from 2 W to 5 W in steps of 0.5 W for laser nanoformed films on rigid polymer substrates. It is evident that the peak shifts from the semi- crystalline silicon peak at 497.86 for as-dried film to crystalline silicon peak at 512.4 cm for laser-nanoformed preannealed film at 5 W with the increase in the incident power FIG. 13 shows the variation in the Raman peak positions with increasing annealing time for Si films deposited with a laser beam of power 5 W on a rigid polymer substrate The Raman peak shifts from the semi-crystalline silicon peak at 497.86 for as-dried film to crystalline silicon peak at 520.69 cm-1 for laser-nanoformed film at 5 W and laser annealed at 1 W for different laser annealing time as shown in FIG. 8(b). It is also evident from FIG. 8(a) that the curve is not a smooth rising curve but shows peaks and valleys. This may be due to the spot over which the Raman analysis was carried out. The surface of the deposited film was rough after high power deposition, which may be the cause for the observed variation. Also the non-uniform distribution of the as-received nanoparticle size resulting in non-homogeneous sintering during the annealing step may significantly contribute to the observed variation in the Raman spectrograph.

This invention can be embodied in other forms without departing from the spirit or essential attributes thereof and, accordingly, reference should be had to the following claims rather than the foregoing specification as indicating the scope of the invention.

We claim:

1. A method of forming crystalline semiconducting layers on low melting or low softening point substrates, comprising the steps of:
   providing an aqueous solution medium including a plurality of semiconductor nanoparticles dispersed therein having a median size less than 10 nm;
   applying said solution medium to at least one region of a substrate to be coated, said substrate having a melting or softening point of <200° C.;
   evaporating said solution medium, and
   laser irradiating said at least one region for fusing said nanoparticles in said at least one region followed by annealing to obtain a continuous film having a recrystallized microstructure.

2. The method of claim 1, wherein said fusing is performed at a first power for a first time, and said annealing is performed at a second power for a second time, wherein said second power is lower than said first power, and said second time is longer than said first time.

3. The method of claim 1, wherein said laser irradiating step comprises continuous wave (CW) laser beam heating.

4. The method of claim 1, wherein said aqueous solution consists essentially of water and said nanoparticles.

5. The method of claim 1, wherein said evaporating step comprises laser evaporating.

6. The method of claim 1, wherein said at least one region is a single continuous film.

7. The method of claim 1, wherein said at least one region comprises a plurality of spaced apart regions.

8. The method of claim 1, wherein said nanoparticles comprise silicon nanoparticles, further comprising the step of in situ doping of said silicon nanoparticles, wherein dopants from said doping are activated during said laser irradiating step.

9. The method of claim 1, further comprising the step of placing a plurality of single crystal seeds on said substrate before said applying step.

* * * * *